(12) United States Patent
Goss et al.

(10) Patent No.: US 8,799,747 B2
(45) Date of Patent: Aug. 5, 2014

(54) DATA HARDENING TO COMPENSATE FOR LOSS OF DATA RETENTION CHARACTERISTICS IN A NON-VOLATILE MEMORY

(75) Inventors: Ryan James Goss, Lakeville, MN (US); David Seekins, Shakopee, MN (US); Mark Allen Gaertner, Vadnais Heights, MN (US); Kevin Gomez, Eden Prairie, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 543 days.

(21) Appl. No.: 12/793,131

(22) Filed: Jun. 3, 2010

(65) Prior Publication Data

US 2011/0302477 A1 Dec. 8, 2011

(51) Int. Cl.
*G11C 29/00* (2006.01)
*G06F 11/00* (2006.01)
*H03M 13/00* (2006.01)

(52) U.S. Cl.
USPC ................ 714/773; 714/746; 714/777

(58) Field of Classification Search
USPC ......... 714/718, 710, 746, 777, 782, 784, 773, 714/763, 779, 701, 719, 753, 758, 801, 714/807; 365/185.33, 230.03, 201; 711/103, 100, 104, 152, 5
See application file for complete search history.

(56) References Cited

U.S. PATENT DOCUMENTS

| | | | |
|---|---|---|---|
| 5,602,987 A * | 2/1997 | Harari et al. | 714/6.13 |
| 5,621,682 A * | 4/1997 | Tanzawa et al. | 365/185.03 |
| 5,761,677 A | 6/1998 | Senator et al. | |
| 5,809,558 A * | 9/1998 | Matthews et al. | 711/173 |
| 5,847,992 A * | 12/1998 | Tanaka et al. | 365/185.03 |
| 5,936,971 A * | 8/1999 | Harari et al. | 714/710 |
| 6,081,447 A * | 6/2000 | Lofgren et al. | 365/185.02 |
| 6,108,236 A | 8/2000 | Barnett | |
| 6,298,425 B1 | 10/2001 | Whitaker et al. | |
| 6,510,083 B1 * | 1/2003 | See et al. | 365/185.24 |
| 6,643,653 B1 | 11/2003 | Chu | |
| 6,751,750 B1 | 6/2004 | Humlicek | |
| 6,880,101 B2 | 4/2005 | Golasky et al. | |
| 6,944,063 B2 | 9/2005 | Chen et al. | |
| 6,981,102 B2 | 12/2005 | Beardsley et al. | |
| 7,099,221 B2 * | 8/2006 | Klein | 365/222 |
| 7,170,782 B2 * | 1/2007 | Conley et al. | 365/185.04 |
| 7,296,213 B2 * | 11/2007 | Vainsencher et al. | 714/784 |
| 7,307,881 B2 * | 12/2007 | Chen et al. | 365/185.09 |
| 7,337,351 B2 | 2/2008 | Zane et al. | |
| 7,415,568 B2 * | 8/2008 | Kawabata et al. | 711/103 |
| 7,428,687 B2 * | 9/2008 | Klein | 714/754 |
| 7,721,165 B2 * | 5/2010 | Tamura et al. | 714/718 |

(Continued)

*Primary Examiner* — Phung M Chung
(74) *Attorney, Agent, or Firm* — Hall Estill Attorneys at Law

(57) ABSTRACT

Method and apparatus for enhancing reliability and integrity of data stored in a non-volatile memory, such as in a solid-state drive (SSD) having an array of flash memory cells. In accordance with various embodiments, a controller is adapted to harden data stored in a first location of said memory in relation to a detected loss of retention characteristics of the first location. In some embodiments, the data are hardened by storing redundancy information associated with said data in a second location of said memory. The redundancy information can be a redundant set of the data or higher level error correct codes (ECC). The hardened data can be recovered to the host during a read operation by accessing the data stored in both the first and second locations.

20 Claims, 6 Drawing Sheets

(56) References Cited

U.S. PATENT DOCUMENTS

| | | | |
|---|---|---|---|
| 7,836,374 B2* | 11/2010 | Klein | 714/754 |
| 7,877,669 B2* | 1/2011 | Eggleston et al. | 714/764 |
| 8,166,267 B2* | 4/2012 | Sinclair et al. | 711/165 |
| 8,170,606 B2* | 5/2012 | Dorsey et al. | 455/552.1 |
| 8,397,101 B2* | 3/2013 | Goss et al. | 714/6.1 |
| 2004/0083333 A1 | 4/2004 | Chang et al. | |
| 2006/0271725 A1* | 11/2006 | Wong | 711/103 |
| 2007/0276987 A1* | 11/2007 | Luo et al. | 711/103 |
| 2008/0155175 A1* | 6/2008 | Sinclair et al. | 711/103 |
| 2009/0024884 A1* | 1/2009 | Klein | 714/718 |
| 2009/0037644 A1* | 2/2009 | Miller | 711/103 |
| 2009/0276586 A1* | 11/2009 | Royer et al. | 711/154 |
| 2010/0011261 A1 | 1/2010 | Cagno et al. | |
| 2011/0149651 A1* | 6/2011 | Gorobets et al. | 365/185.03 |
| 2012/0284587 A1* | 11/2012 | Yu et al. | 714/773 |
| 2013/0097473 A1* | 4/2013 | Tanaka et al. | 714/764 |

* cited by examiner

ERASURE BLOCK FORMAT

SECTOR (LBA) FORMAT

PAGE FORMAT

DATA HARDENING TO COMPENSATE FOR LOSS OF DATA RETENTION CHARACTERISTICS IN A NON-VOLATILE MEMORY

SUMMARY

Various embodiments of the present invention are generally directed to a method and apparatus for enhancing reliability and integrity of data stored in a non-volatile memory, such as in a solid-state drive (SSD) having an array of flash memory cells.

In accordance with various embodiments, a controller is adapted to harden data stored in a first location of a memory in relation to a detected loss of retention characteristics of the first location. In some embodiments, the data are hardened by storing redundancy information associated with said data in a second location of said memory. The redundancy information can be a redundant set of the data or higher level error correct codes (ECC). The hardened data can be recovered to the host during a read operation by accessing the data stored in both the first and second locations. The first and second locations may be one or more erasure blocks in a non-volatile memory array.

These and other features and advantages which characterize the various embodiments of the present invention can be understood in view of the following detailed discussion and the accompanying drawings.

DETAILED DESCRIPTION

Figure 1:
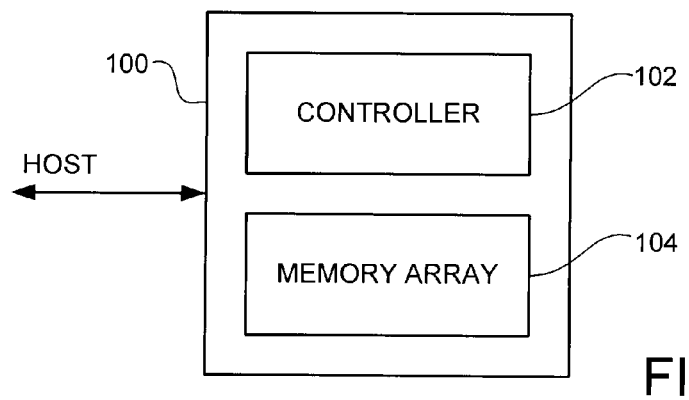
FIG. 1 provides a functional block representation of a data storage device constructed and operated in accordance with various embodiments of the present invention.

The present disclosure generally relates to systems and methods for enhancing the reliability and integrity of data stored in a non-volatile memory. Solid state data storage devices can employ an array of memory cells to store data as a sequence of bits. Some types of memory cells, such as flash memory cells, can endure only a limited number of access operations before the cell structures begin to degrade. For example, some current generation flash memory cells that store multiple bits per cell (so-called MLC or multi-level cells) can only retain stored data for a few months after 5,000 access operations have taken place upon the cells.

A variety of approaches have been proposed in the art to reduce the effects of operational wear on solid state memory cells. These approaches include the implementation of wear leveling techniques to uniformly distribute write and erase operations across the array, and the use of write deamplification techniques to reduce the number of write operations required to update and manage data stored to the array. While operable, there remains a need for improvements in the manner in which data are stored to an array having memory cells with advanced levels of wear.

Various embodiments of the present invention are accordingly directed to an apparatus and method for hardening data stored in a memory array, such as but not limited to a flash memory array. As explained below, a variety of techniques may be employed to enhance the integrity and reliability of the stored data.

In some embodiments, a detected loss of retention characteristics can be provided in relation to wear indication (WI) values maintained for different locations within the memory array, such as for each erasure block in the array. The wear indication values provide an accurate indication of the wear history of the associated blocks, and may be determined in relation to the total number of access operations (e.g., erasures, writes) that have taken place upon the associated block. Other metrics associated with the block may also be used to formulate the wear indication value.

When data are presented for writing to the array, a suitable target location for the storage of the data is identified, such as a selected page in a first erasure block. The wear indication value of the target location is assessed to determine the wear state thereof. When the target location is sufficiently worn, additional redundancy information is stored elsewhere in the array for the input data to ensure the data can be correctly retrieved from the target location during a subsequent read operation. This redundancy information may be stored in a second erasure block, and may comprise a duplicate set of the data or additional levels of error correction codes (ECC). Data from both the first and the second erasure blocks can be used during readback to ensure proper retrieval of the stored data.

In further embodiments, garbage collection operations may be periodically carried out to reallocate erasure blocks for use in storing new data. When a selected erasure block is identified for garbage collection, any current version data within the block is accumulated and moved to a new location to allow the selected block to be erased and placed back into the available allocation pool. Redundancy information, such as additional levels of ECC codes, can be generated and stored for the set of garbage collected data.

In still further embodiments, the wear indication values can be used to alter the voltage profiles used to write and/or read data to/from various locations. Self-monitoring routines can provide real-time notifications to a host with regard to the status of the array and/or the data, allowing the user to take affirmative steps to alter the operation of the device to extend its useful life.

These and other aspects of various embodiments can be understood beginning with a review of FIG. 1, which depicts an exemplary data storage device 100. The device 100 is characterized as a solid-state drive (SSD) that employs non-volatile flash memory, although the present disclosure is not so limited.

The device 100 includes a controller 102 which provides top-level control and communication functions as the device interacts with a host device (not shown) to store and retrieve host user data. A memory array 104 provides non-volatile storage of the data in the form of an array of flash memory cells. It will be appreciated that a number of additional circuits may be incorporated into the device as desired, such as an input/output (I/O) communications circuit, one or more data buffers, a hierarchical cache structure, read/write drivers, local dynamic random access memory (DRAM), and on-the-fly ECC generating circuitry.

The controller 102 may be a programmable CPU processor that operates in conjunction with programming stored in a computer memory within the device. The controller may alternatively be realized in hardware, or the controller functionality may be incorporated directly into the memory array 104.

Figure 2:
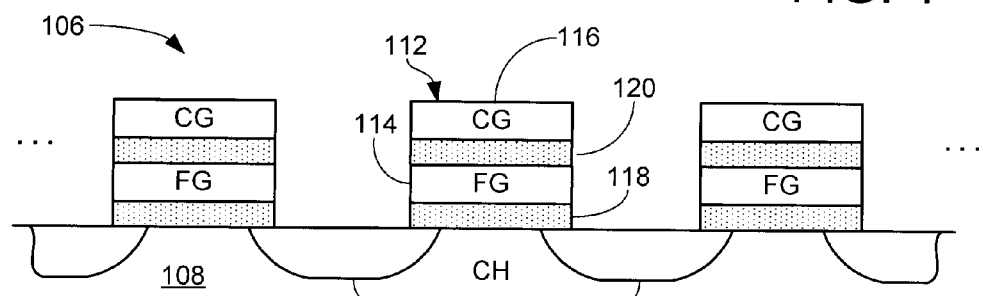
FIG. 2 illustrates a number of memory cells of the array of FIG. 1, which in some embodiments are characterized as non-volatile Flash memory cells arranged in a NAND configuration.

FIG. 2 represents a number of flash memory cells 106 of the array 104 of FIG. 1 arranged in a NAND configuration. A substrate 108 includes spaced apart, localized doped regions 110. Adjacent pairs of the doped regions are spanned by gate structures 112 each comprising a floating gate (FG) 114, a control gate (CG) 116, and respective insulating oxide layers 118, 120. Application of a suitable gate voltage to a selected floating gate (FC) 114 establishes a conductive channel (CH) between the adjacent doped regions 134, thereby generating a drain-to-source conductivity path.

During a programming (data write) operation a write current is induced through the channel of a selected memory cell from one doped region 134 to the next. As the write current passes through the channel, charge will migrate from the channel, through the lower oxide layer 118 to the floating gate (FG) 114. The presence of accumulated charge on the floating gate 114 serves to alter the requisite threshold voltage $V_T$ applied to the control gate 116 to establish conductivity through the channel.

The flash memory cells 106 can store different programmed values in relation to different amounts of accumulated charge on the floating gate 114. In some embodiments, the cells 106 are arranged as multi-level cells (MLCs) so that each cell stores multiple bits of data. For example, four (4) different charge levels can be used to store two bits per cell (e.g., cell bit values 00, 01, 10 or 11 respectively). Different voltage threshold magnitudes can be sequentially applied to the control gate 116 to discriminate between these respective states during a read operation.

The memory cells 106 can alternatively be configured as single-level cells (SLCs) so that each cell stores a single bit of data (e.g., cell bit values of 0 or 1) based on the presence or absence of accumulated charge on the floating gate 114. In some embodiments, some cells in the array 104 can be configured as MLCs and other cells in the array can be configured as SLCs. A given set of cells operated in one mode, such as MLC, can be erased and subsequently operated in the other mode, such as SLC, and vice versa.

An erasure operation is required to remove the accumulated charge from the floating gate and return the floating gate to an uncharged state (e.g., states 1 or 11) prior to the writing of new data to the cell. Such erasure operations are carried out on a set of the memory cells arranged as an erasure block. The physical migration of charge across the floating gate-channel boundary during write and erase operations can degrade the reliability of the memory cells over time.

While MLC programming provides certain advantages such as higher data storage densities, it has been found that cells configured as MLCs can experience significantly greater rates of wear as compared to the same cells configured as SLCs. This is due to a number of factors, including the fact that greater amounts of charge will tend to be stored on the floating gate of an MLC as compared to an SLC, and higher programming, reading and erasure voltages may be required to operate the MLC as compared to an SLC.

Figure 3:
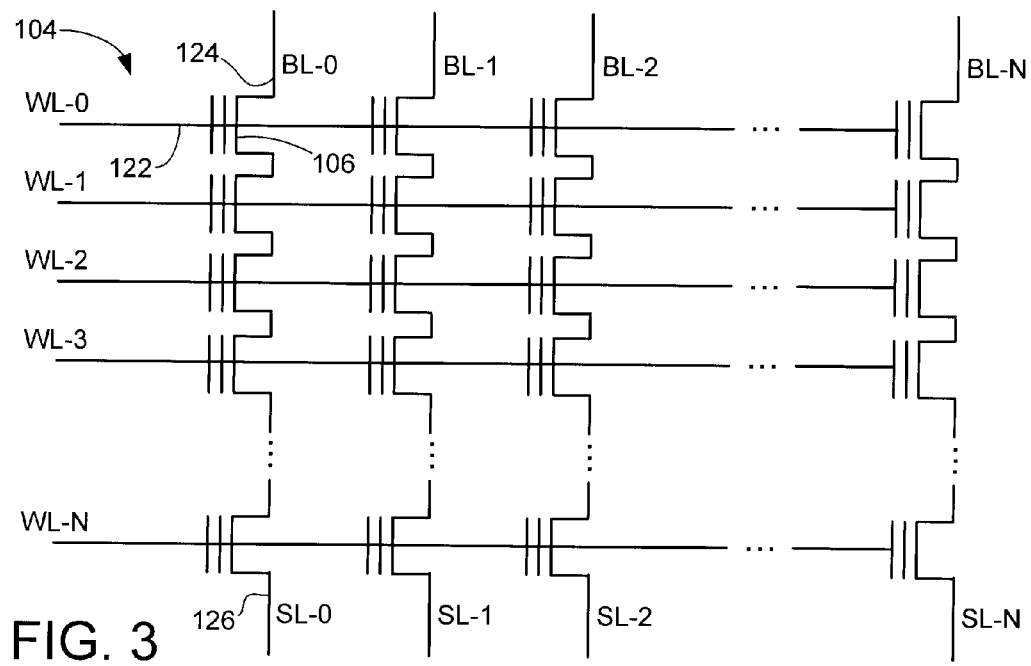
FIG. 3 is a schematic representation of a portion of the array of FIG. 1.
Figure 4A:
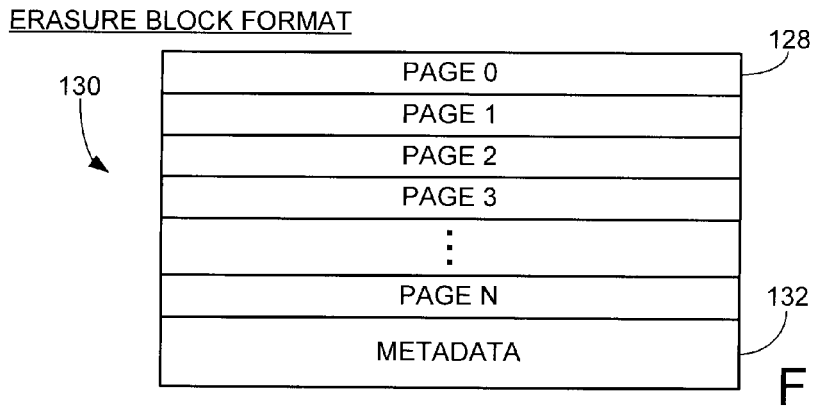
FIG. 4A sets forth an exemplary format for an erasure block of the array.

FIG. 3 schematically depicts a number of the memory cells 106 of FIG. 2. The cells are arranged into rows and columns and are accessed by various control lines identified as word lines (WL) 122, bit lines (BL) 124 and source lines (SL) 126. Respective voltage profiles are applied to the various control lines to read, write and erase data from the cells 106. While not limiting, it is contemplated that all of the memory cells along each row (e.g., connected to a common word line 122) form a separate page 128 of memory in an erasure block 130, as shown in FIG. 4A. An exemplary erasure block format has a total of 256 pages, with each page storing 8192 bytes of data. The erasure block 130 generally represents the smallest block of flash memory cells that can be erased at a time.

Metadata may be generated for use with each block 130. The metadata may be stored in a metadata block 132 appended to the end of the erasure block 130 as shown, or may be stored elsewhere in the device 100 such as in one or more erasure blocks dedicated to this purpose. The metadata provides certain types of overhead control information such as the logical addresses of the data stored in the associated erasure block. Other data relating to the erasure block may also be stored in the metadata block 132, such as a timestamp or other sequence information relating to when the block 130 was most recently allocated for use.

Figure 4B:
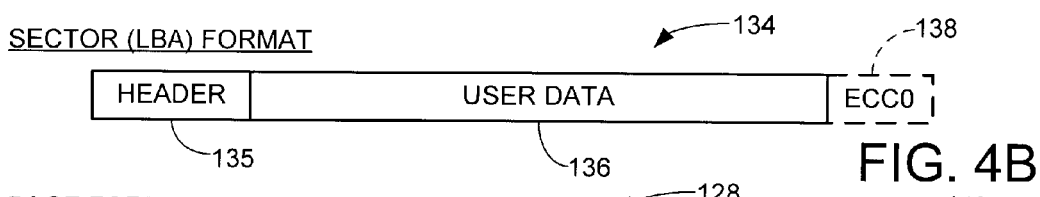
FIG. 4B shows an exemplary format for a sector of data stored in the erasure block of FIG. 4A.

User data from the host can be stored in the form of addressable blocks (sectors) 134 such as depicted in FIG. 4B. It is contemplated that each sector 134 will have an associated logical block address (LBA) used by the host in identifying the user data stored therein. The exemplary format of FIG. 4B shows each sector to include a header field 135 and a user data field 136. The header field 135 stores the LBA value and other control or status information for the sector. The user data field 136 stores a selected amount of user data, such as 512 bytes, 4096 bytes, etc.

As desired, an optional error correction code (ECC0) block can be incorporated into each sector 134. Error correction codes allow the device 100 to detect and correct up to a selected number of errors in data read back from the array. The ECC0 codes can be calculated to correct readback errors from the header and user data fields 135, 136, and can take any number of forms including Read Solomon codes, BCH codes, low density parity codes (LDPCs), checksums, or some other suitable form of coding.

Figure 4C:
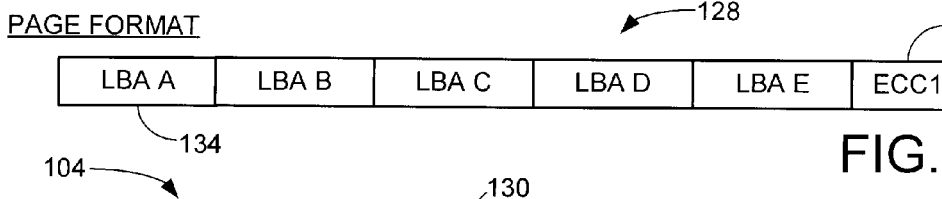
FIG. 4C illustrates an exemplary format for a page of data in the erasure block of FIG. 4A.

FIG. 4C shows an exemplary manner in which the sectors (LBAs) 134 of FIG. 4B can be stored to the pages 128 of FIG. 4A. Generally, multiple sectors may be stored to each page, as indicated by exemplary LBAs A-E. Data compression techniques may be employed as desired so the total number of physical cells occupied by each sector may vary. An entire page's worth of data will usually be written at a time. The last sector on a page may be split into two portions with the first portion filling out the remaining available space on a first page, and the remaining portion of the split sector being placed at the beginning of the next page.

Error correction codes may be generated for each page, as indicated by ECC1 field 140. In some embodiments, the ECC1 codes are used in lieu of the ECC0 codes of FIG. 4B to conserve space, although both sector and page level error codes can be used. As with the ECC0 codes, the ECC1 codes can take a variety of forms including Read Solomon codes, BCH codes, low density parity codes (LDPCs), checksums, or some other suitable form of coding. ECC codes may also be generated for a group of sectors less than a full page's worth of sectors, or for a block of sectors that spans multiple pages.

When user data are received from the host for storage to the memory array 104, the controller 102 or other control circuitry accumulates the data in a local cache on a page basis, generates the associated error correction codes at the sector, page and/or block, and writes the data and codes to an available page 128 in an allocated available block 130. If less than a full page worth of data is presented for writing, filler bits may be appended to complete the page write. The metadata are updated as the additional sectors are added to a given block 130.

Figure 5:
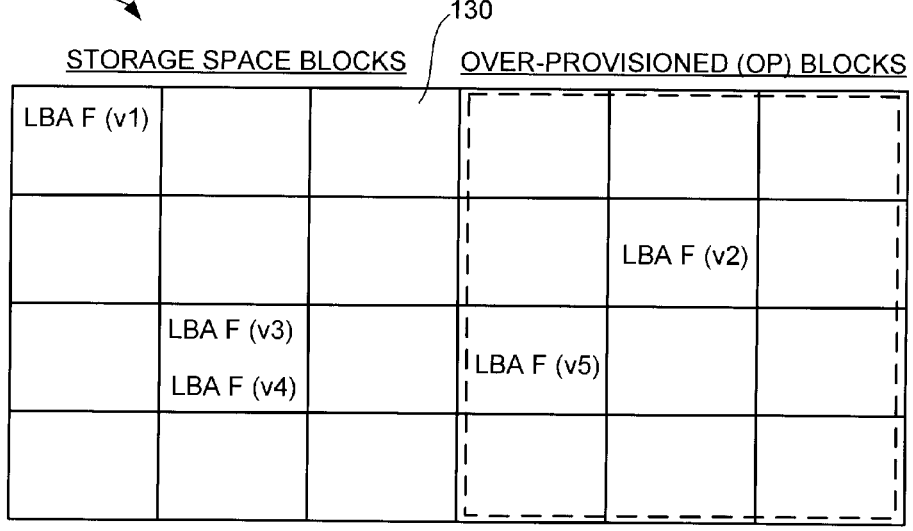
FIG. 5 is a functional representation of the array for which wear indication values are accumulated in a table of memory in accordance with various embodiments.
Figure 5:
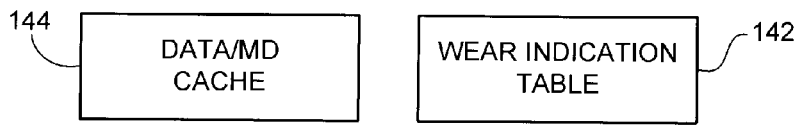

FIG. 5 shows the memory array 104 of FIG. 1 to be made up of an array of erasure blocks 130 as set forth by FIG. 4A. The blocks 130 may be physically adjacent to one another, or may be physically disposed on different layers, stripes, lanes or chips (dies). Each block 130 will have its own erasure block address.

Because the exemplary flash memory cells need to be erased before new data can be written thereto, it is common for devices to write updated versions of sectors having the same LBA identifier in different locations within the array. Each time the host provides a write command to write a selected LBA, the device 100 writes the data to a new page within the array 104.

The most recently stored version of the LBA represents the "current" data, and all previously stored versions constitute older "stale" data. The metadata utilizes forward pointers to enable the system to locate the current version of the data responsive to a read request for a particular LBA. This is illustrated in FIG. 5 for a selected LBA F, of which five different versions have been stored to the array. Version 5 (v5) represents the current, most recently stored version of the sector data for LBA F, and the metadata will point to this location. The v5 data will be returned to the host responsive to a read request for LBA F. The remaining versions v1-v4 represent older, stale data for LBA F, and will be ignored during a read operation for the sector unless the host specifically requests an older archived version of the sector using a special utility command.

Garbage collection operations may be periodically carried out by the device 100 to reclaim blocks 130 that store stale data. Garbage collection operations take place in the background and may be scheduled at appropriate times, such as during idle periods with low host I/O activity. When most or all of the data in a selected block 130 are determined to be stale, the garbage collection process will erase the selected block and place the erased block back into an allocation pool of available blocks. Any current data in the block will be copied to a newly allocated block prior to the erasure operation. Multiple blocks 130 may be grouped together and concurrently subjected to an erasure operation as desired. The erasure blocks 130 are sometimes referred to herein as garbage collection blocks (GCUs). A GCU may constitute a single erasure block or a set of erasure blocks that are allocated and erased as a unit.

FIG. 5 divides the array 104 into two portions. The leftmost portion of the array is identified as "storage space" blocks, and the rightmost portion of the array is identified as "overprovisioned" or OP blocks. This division signifies the fact that the storage device 100 is provided with extra physical storage space beyond that required for its rated data capacity. The additional OP storage space is provided to reduce excessive movement of data within the device 100, as well as to extend the useful life of the device.

The amount of additional OP space may be upwards of 100% or more of the rated device data storage capacity. It will be appreciated that the blocks 130 denoted in FIG. 5 as OP blocks are regular blocks available for allocation by the device as desired, and are not kept in reserve or remain unused. The OP space that is available for allocation at any given time will be referred to as available OP (or AOP).

In accordance with various embodiments, the device 100 operates to apply wear leveling to the array 104 so that each of the blocks 130 receives roughly the same amount of wear over time. Different ones of the erasure blocks 130 will be allocated for use so that no one erasure block receives a significantly greater number of writes and erasures than other blocks. This wear leveling helps to extend the operational life of the array, and can be implemented by having the controller 102 maintain a history sequence of GCU allocations, and selecting new blocks 130 for allocation in an order such that each block generally receives the same amount of utilization.

The wear history of each block 130 is tracked in relation to a wear indication (WI) value which indicates the relative status of the block in terms of its remaining operational life. This provides an indication of a potential loss of retention characteristics for each block. The wear indication value can be generated in a variety of ways. In some embodiments, the wear indication value is simply an accumulated count of access operations, such as follows:

$$WI = COUNT \quad (1)$$

where COUNT is an accumulated access count value for the associated block over the operational life of the block. The COUNT value may be the total number of erase cycles for the erasure block, the total number of write operations to write data to the block, the total number of read operations that have been carried out upon the block, or some combination thereof.

In other embodiments, a soft metrics approach is used whereby a number of parameters are accumulated and used to arrive at the final wear indication value. A composite wear indication value can be determined such as:

$$WI = A*COUNT + B*TEMP + C*ACCESS + D*ERROR\ RATE + E*MODE \quad (2)$$

where COUNT is the accumulated access count, TEMP is a temperature (or temperature range) over which the erasure block has been operated, ACCESS is a metric associated with a rate at which data have been written and/or read (e.g., high or low voltage levels, faster or slower access rates, etc.), ERROR RATE indicates measured error rates of programmed cells carried out during background self-testing, MODE indicates MLC or SLC programming mode, and A, B, C, D, E are scalar weighting values. The factors selected and the individual weighting values can be generated based on computer modeling or empirical analysis. Other methodologies and/or factors can be used to assess the wear history of each block, including higher order models. Wear indication values can additionally or alternatively be generated on a per chip, stripe, layer or page level as desired.

Whatever methodology is used, the wear indication value is intended to provide a reasonably accurate indication of the wear status of a given location. This allows assessment of both the absolute wear status of a given set of cells in relation to their specified operational life, as well as the relative wear status of the cells as compared to other cells; that is, a first set of cells can be adjudged as being less worn than a second set of cells.

The wear indication values are shown in FIG. 5 to be stored in a wear indication value table 142 in an available computer memory location. This memory location may constitute a local volatile buffer to which the WI values are loaded during system initialization from non-volatile storage, such as from one or more dedicated erasure block(s). The table 142 may be updated during the course of device operation, and the updated table may be copied to the dedicated block at shutdown and at other suitable times. A second local memory location provides a cache 144 to store data and metadata (MD) as required. Other parametrics and control information may be maintained in the respective memories 142, 144 during operation.

Figure 6:
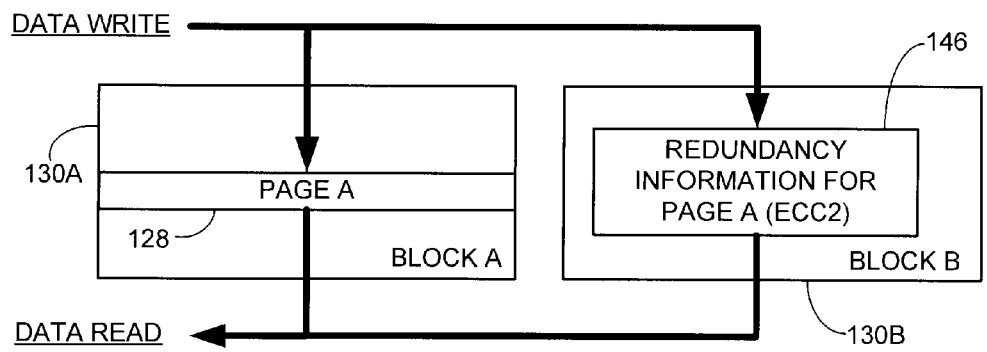
FIG. 6 depicts a write data sequence in accordance with some embodiments.

An exemplary data write operation is depicted in FIG. 6. The write operation is contemplated as occurring responsive to a host request to write one or more sectors of data to the array 104. It will be appreciated that multiple sectors may be concurrently written at this time to provide a full page worth of data. These data are identified as Page A and may have a format as shown in FIG. 4C.

The device 100 will operate to schedule the writing of the input user data while temporarily retaining the data in a local cache such as the memory 144 in FIG. 5. Appropriate error correction codes (e.g., ECC1) may be generated at this time. The device will select an appropriate target location for the data, such as selected erasure block 130A (Block A). This block may be selected using a GCU sequence number or other parameter. Once selected, the controller will retrieve the associated wear indication value for the block. In some embodiments, the wear indication values are also used to select the ordering of GCU allocations. If the wear indication value indicates that the block 130A has an advanced level of wear, the device will generate additional redundancy information associated with the data from Page A.

This additional redundancy information may take a variety of forms, such as a higher level of error correction codes (ECC2) calculated for the contents of Page A. The ECC2 codes may be Reed Solomon, BCH, LDPC, multi-dimensional parity codes, checksums, or some other suitable coding values. The ECC2 codes will enable the detection and correction of up to a selected number of errors in the Page A data during a subsequent data retrieval operation. The redundancy information may alternatively or additionally constitute a duplicate of the Page A data in compressed or uncompressed form, although this approach would tend to be data storage intensive.

The device 100 thereafter schedules and executes the writing of the Page A data to relatively more worn Block A, and the redundancy information is written to a second, less worn erasure block 130B (Block B). In this way, the data for Page A are hardened to the extent that redundancy data are stored in a less worn location, and this redundancy information can be made available to ensure accurate data retrieval of the Page A data during a subsequent read operation.

It will be appreciated that the storage of the redundancy information in a less worn location is not necessarily required. Rather, in other embodiments the redundancy information may be written to a relatively more worn location, or even to a different location within the same erasure block (thus having essentially the same wear state). In each case, the availability of both the originally filed data and the redundancy information within the system enhance the ability to reliably recover the data during a read operation.

Figure 7:
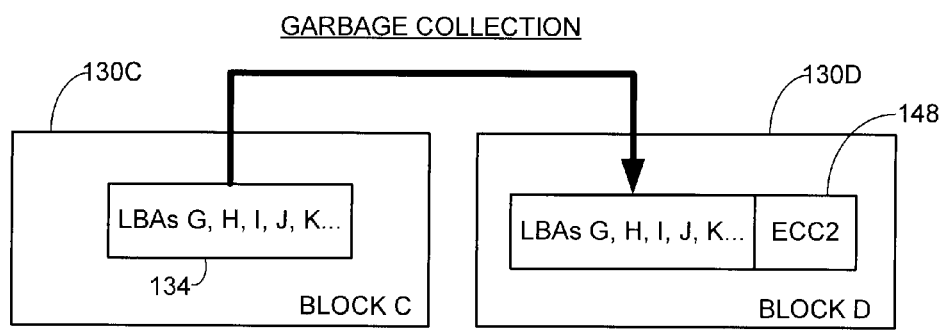
FIG. 7 illustrates a garbage collection sequence in accordance with some embodiments.

An exemplary garbage collection operation is depicted by FIG. 7. A selected erasure block 130C (Block C) is scheduled for reallocation on the basis that most of the data stored therein are stale. The metadata are used to identify current versions of data that need to be relocated out of Block C prior to erasure of the block. These current versions of data may or may not be on a common page of memory, and are identified collectively in FIG. 7 as LBAs, G, H, I, J, K . . . .

During the garbage collection process, the current version LBAs are accumulated and temporarily moved to a local cache such as 144 in FIG. 5. Redundancy information such as ECC2 codes are calculated for the accumulated data, and the LBAs and ECC2 values are written to an available erasure block 130D (Block D). Lossless data compression techniques may be applied to the accumulated data to reduce the required amount of storage space in the new location.

The wear indication value for Block D is consulted to determine the wear status of the block and, as before, it contemplated that Block D will be less worn than Block C. In some embodiments, ECC2 values will only be calculated if the wear indication value for Block D exceeds a predetermined threshold. In other embodiments, the ECC2 values are calculated regardless of the wear status of Block D since the garbage collection process provides a convenient point to generate the error codes for the accumulated data.

As shown in FIG. 7, the ECC2 values can be stored to Block D coincident with the storage of the accumulated data garbage collected from Block C. Alternatively, the ECC2 values can be stored to a different location such as the separate Block B in FIG. 6. Block B may represent one or more dedicated erasure blocks within the AOP that only store redundancy information for data stored elsewhere in the array. Once the accumulated current data from Block C have been confirmed as being written to Block D, the garbage collection process proceeds to erase Block C and place the erased block into the allocation pool of available blocks.

When one or more of the erasure blocks 130 in the array 104 are dedicated to the storage of all of the redundancy information, a simple bit value, such as in the header or metadata regions of the other blocks, can be set to indicate the presence of additional redundancy information in the dedicated blocks. The redundancy information can be indexed based on address, and accessed through the use of a simple hash function. This allows the redundancy information to be easily retrieved when a data access operation occurs. Alternatively, a lookup table can be provided and consulted to identify the existence and address of the redundancy information for a given set of data.

Figure 8:
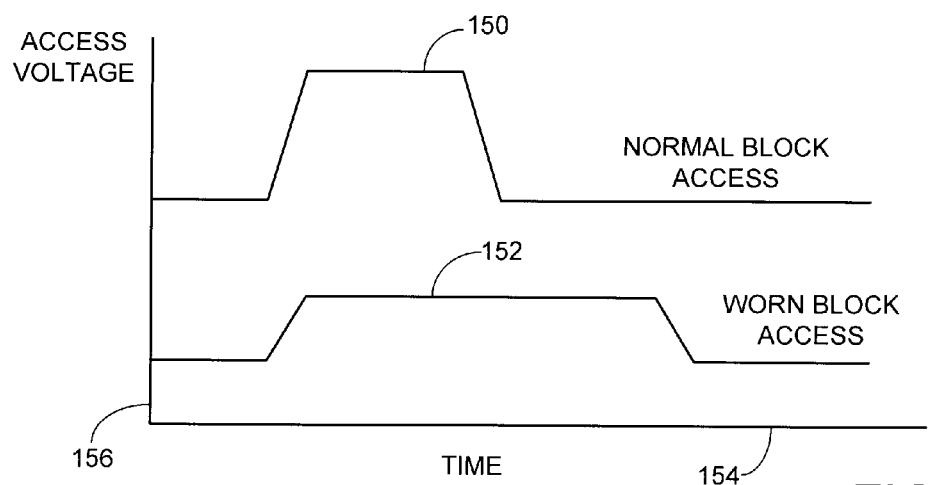
FIG. 8 provides different access voltage profiles used during access operations for a normal block and a relatively worn block.

Additional steps may be taken to enhance the reliability of the data stored in the array. FIG. 8 shows a pair of voltage profiles 150, 152 plotted against a common elapsed time x-axis 154 and a common amplitude y-axis 156. Profile 150 represents a voltage profile that may be applied to memory cells during a write, read or erase operation during a normal mode of access. It will be appreciated that the particular duration and magnitude of the voltage pulse, as well as the control line(s) to which such pulse is applied will vary depending on whether the cell is being written, erased or read. Nevertheless, it can be seen that the pulse is provided with a relatively high voltage magnitude and a relatively short duration so that the respective access operation is carried out relatively quickly.

By contrast, the profile 152 indicates the same types of access operations may be carried out using a relatively lower magnitude, longer duration pulse. The profile 152 can be applied during access operations upon blocks with higher levels of wear. Other gradual read/write access profiles can be applied as well, such as reduction in the usage of higher voltage threshold levels for MLC cells during read operations.

The operational life of a given array may be influenced by how the array is used in the host environment. Write intensive environments will tend to lead to faster wear as compared to read intensive environments. A streaming I/O environment is likely to provide longer life as compared to random and burst read I/O environments. MLC programming will provide greater data storage capacity for the host but will lead to faster wear than SLC programming, and so on. The various embodiments set forth herein can be implemented adaptively and tailored to match host usage requirements.

In some embodiments, the device 100 will operate in a "normal" fashion for much of its operational life, with the various algorithms for hardening data commencing implementation as the device begins to near the end of the specified warranty period, or as selected locations within the array begin to achieve advanced levels of wear.

In some embodiments, the AOP used for the redundancy information can be pre-allocated or allocated on demand. The redundancy information can be formatted in different dimensions (e.g., P0 column and P1 row parity codes) to provide higher levels of correction power. Cells with higher wear levels can be converted from MLC to SLC and can use slower read/write access profiles, and pages within a given block can be deallocated while remaining portions of the erasure block are still used. The amount and type of hardening can also be tied to time/resource constraints; for example, a lower level of hardening may be applied to meet power-down time constraints, and a higher level of hardening may be applied at other times when there is sufficient time to generate stronger redundancy information.

In further embodiments, the controller 102 will operate in the background to periodically carry out various self-tests of the existing data to access wear level rates. For example, previously stored data may be internally read out and error rates (or other measures such as channel quality values) may be internally generated. If a particular block is found to have an excessive error rate, the data may be copied to a new location, or the data may be left where it is and redundancy information may be generated and stored for the data in the AOP. Such on-going data hardening operations may be carried out in a manner that is invisible to the host.

It is contemplated that the device 100 may be operated as an external storage device to provide long term backup storage in a computer system. The user may power down the device, remove the device from an available power source (e.g., a USB port, etc.) and set the device aside for a period of months or years before powering up the device again.

In such case, the controller will not be able to carry out background data hardening operations while the device is powered down. This may be a problem if data stored in certain worn memory cells are not hardened before the device is shut down since, during the extended shutdown, the accumulated charge on the floating gates of the worn data cells may leak out to the substrate and the user may not be able to recover the previously stored data when the device is eventually powered up again.

Accordingly, in further embodiments the user may be directed to signal this intent to shut down the device for an extended period of time. This can be carried out through warning screens displayed on a GUI that inform the user to indicate this desire to the device, or the product documentation can provide instructions on how to prepare the device for long term disconnected storage.

When such an indication is communicated by the user to the device, prior to the extended shutdown period the device may proceed to calculate and store redundancy information in the AOP for some (or all) of the stored data. In this way, the device will more likely be able to return all of the stored data to the user when the device is subsequently powered up in the future.

Alternatively or additionally, the device may be provided with a small power supply (such as a rechargeable battery or capacitor) with sufficient stored power to enable the controller 102 to quickly generate redundancy information for all stored user data (or all current version data) in the device and store this redundancy information in the AOP. This may be triggered, for example, by detecting a disconnection of the device or other event that indicates that the device may be in a unpowered state for an extended period of time. Thus, the extended shutdown hardening may commence automatically or responsive to a user prompt.

Figure 9:
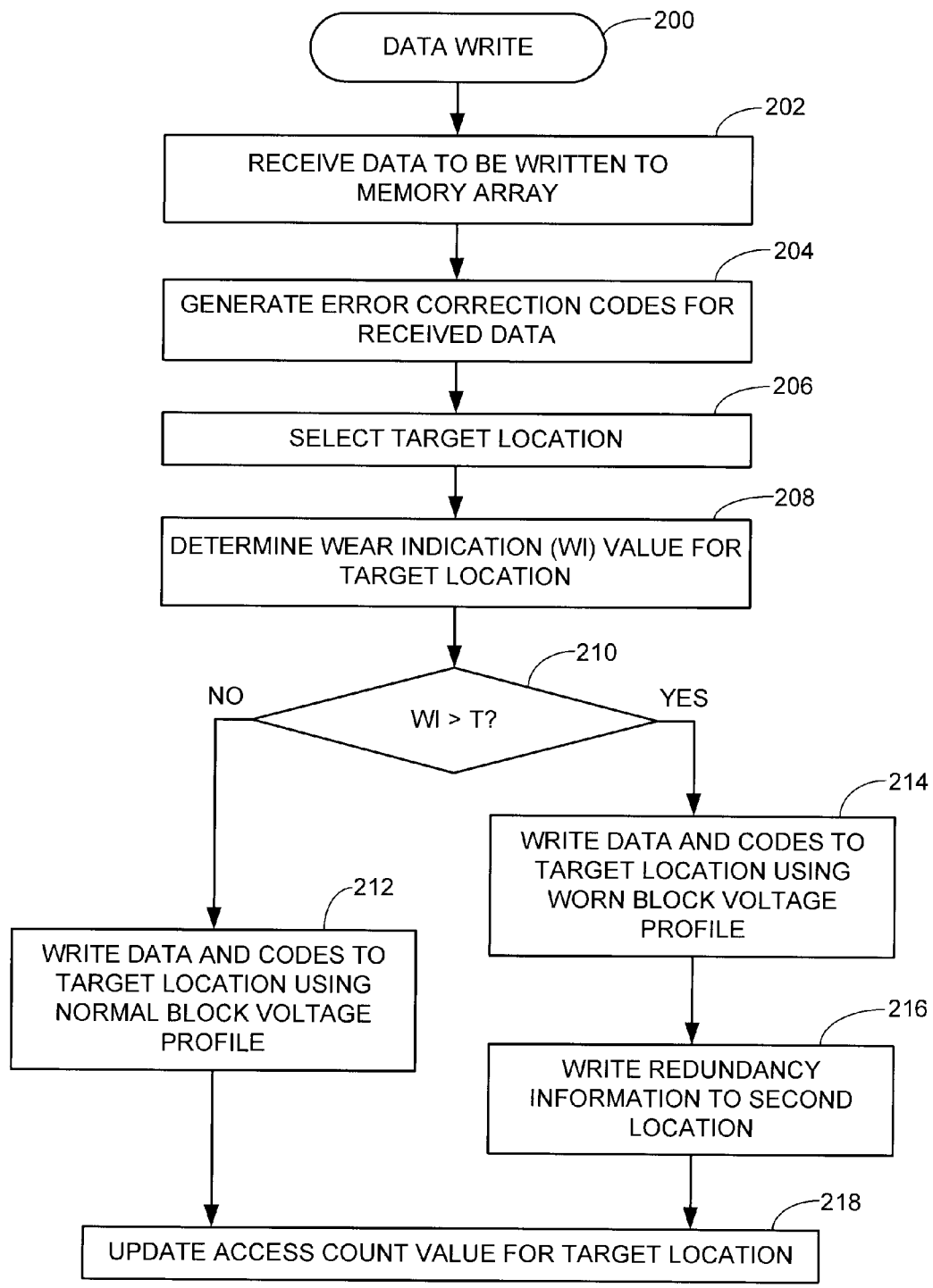
FIG. 9 is a flowchart for a DATA WRITE routine generally illustrative of steps carried out in accordance with various embodiments of the present invention.

FIG. 9 sets forth a flow chart for a DATA WRITE routine 200 illustrative of steps carried out by the controller 102 in accordance with various embodiments to write data to the array 104. Data to be written are received from the host at step 202. The data are stored in a local cached pending scheduling of the write operation. The data may be arranged into one or more groups of data at page boundaries. Associated error correction codes (such as ECC0 and/or ECC1 codes) are generated at step 204.

A target location to which the cached data will be stored is selected at step 206. The target location may be an available page in a currently allocated erasure block. The wear indication (WI) value for the target location is obtained at step 208, such as by retrieval from a wear indication value table (142, FIG. 5). Alternatively, the WI value may be calculated at this time based on accumulated metrics.

A determination is made whether the target location has an advanced state of wear. This can be carried out by comparing the WI value to a predetermined threshold T, as shown by decision step 210. The determination may be made in other ways, however, such as by using a relative or comparative measure to the age of other locations in the array.

If the target location is found to not be excessively worn, the data and codes are written to the target location in accordance with normal processing, as shown by step 212. On the other hand, if the target location is found to have an advanced level of wear, the flow passes to step 214 where the data and codes are written to the target location using a lower stress approach, such as by the worn block voltage profile 152 illustrated in FIG. 8.

Redundancy information is generated and written to a second location at step 216 to aid in the recovery of the data written to the target location. Identifier bits or other values may be set to enable the system to identify the presence of and to retrieve the redundancy information when the base information is subsequently retrieved. Finally, the access count is updated for the target location at step 218 and the process ends.

During a subsequent read operation upon the data stored by the routine of FIG. 9, the controller will direct the array to retrieve the requested data and apply error correction processing to the data using codes retrieved with the requested data.

It will be appreciated that the retrieval operation will output a sequence of bits from the target location to the local cache, and this sequence of bits may have one or more bit errors. The retrieved bits making up the error correction codes (e.g., ECC0, ECC1) will be used in an effort to detect and correct errors in the retrieved data to provide output corrected data.

If the data are recovered without any uncorrected errors, the data are transferred to the host. If the access counts include read operations, the associated read count value is incremented in the appropriate location in memory. On the other hand, if one or more uncorrected errors are detected in the output sequence, the system will proceed to retrieve the redundancy information and use this information to correct the errors.

It is contemplated that if the redundancy information is needed to correct errors in the recovered data, the data will be retained in local cache and a write operation will be scheduled in accordance with the flow of FIG. 9 to move the data to a new location within the array 104. New redundancy information may be generated and stored, or pointers will be generated to allow continued use of the previously generated redundancy information.

In an alternative embodiment, a read operation upon the data will trigger the concurrent recovery of both the data stored in the target location (e.g., a first erasure block) and the redundancy information stored in the redundant location (e.g., a second erasure block). Both types of retrieved data will be used to recover the requested user data for the host.

Figure 10:
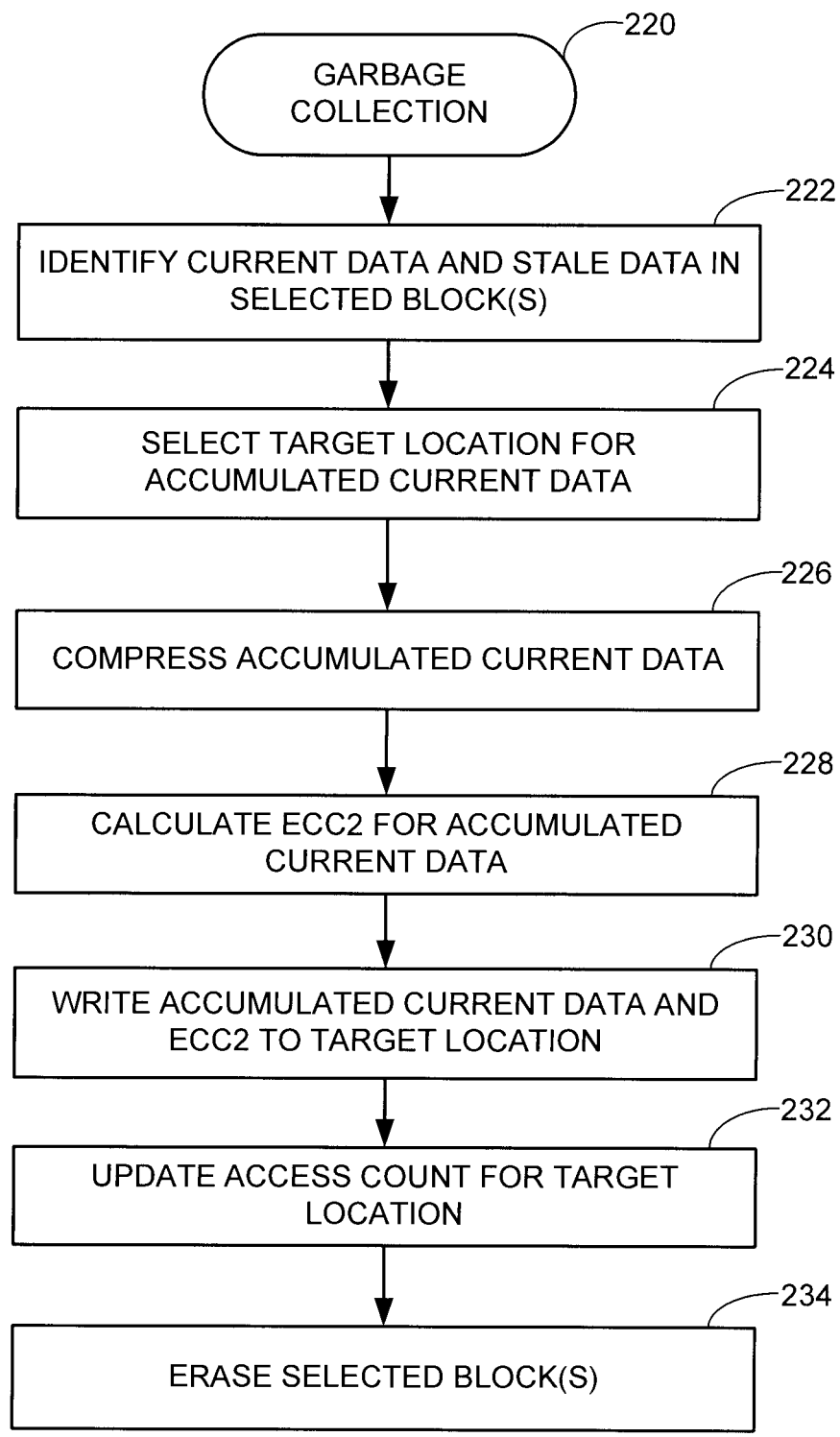
FIG. 10 shows a flowchart for a GARBAGE COLLECTION routine generally illustrative of steps carried out in accordance with various embodiments of the present invention.

FIG. 10 shows a flow chart for a GARBAGE COLLECTION routine 220, generally illustrative of steps carried out by the controller 102 to reallocate storage space within the array 104 in accordance with various embodiments. At step 222, one or more erasure blocks 130 (FIG. 5) will be scheduled for erasure based on a relative ratio of stale data stored therein or on other parameters. Any current data stored within the identified block(s) are identified during this step.

A target location for the current data is selected at step 224, which may be from the AOP pool. The current data are read out and temporarily cached pending transfer, and may be compressed as indicated by step 226 to conserve storage space.

Redundancy information is generated for the accumulated data at step 228. As noted above, this redundancy information may comprise higher level error correction codes (e.g., ECC2) for the compressed accumulated data. The codes may further be multi-dimensional (e.g., P0 and P1 parity codes for rows and columns of data, etc.). The accumulated data and the codes are thereafter written to the array at step 230. In some embodiments, both are written to the same erasure block as depicted in FIG. 7, although in other embodiments the redundancy information will be written elsewhere such as to a dedicated location for such information. The access count for the target location is updated at step 232, and the selected block(s) from step 222 are erased and placed into the allocation pool.

Figure 11:
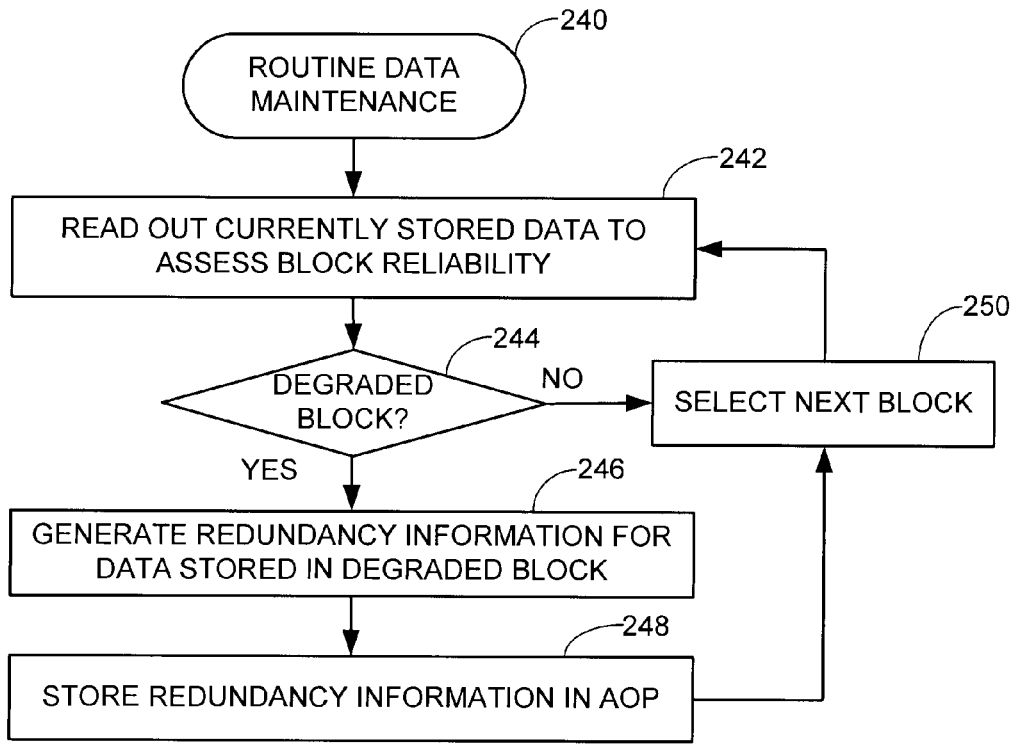
FIG. 11 sets forth a ROUTINE DATA MAINTENANCE routine generally illustrative of steps carried out in accordance with various embodiments of the present invention.

FIG. 11 provides a ROUTINE DATA MAINTENANCE routine 240 illustrative of steps carried out by the controller 102 to assess and improve the reliability of the array 104 in accordance with various embodiments. The routine can be continuously carried out in the background to assess current reliability trends and to harden the data stored in worn locations. The routine may also be implemented by the device performing monitoring and providing a notification to the host that, without data hardening, the data may be below retention specifications. In this way, a user directed prompt may initiate the routine 240.

For those blocks selected for analysis, previously stored data are read out during step 242 to assess block reliability. Error rates or other performance measures may be obtained during this step. Such operations may also occur consonant with host requested read commands to retrieve data to the host.

If the block is found to provide degraded performance, as indicated by decision step 244, redundancy information will be generated for the data stored in the degraded block, step 246. This redundancy information may be generated for all of the data stored in the erasure block, or may be generated for just those pages (or other portions) found to have increased error rates. It will be noted that the system may have been able to correctly retrieve the data after the application of error correction, but the relative number of errors that had to be corrected may be sufficient to indicate the block as being degraded.

The redundancy information generated during step 246 is thereafter stored in step 248. In some embodiments, the degraded data remains as it was and the redundancy information serves as backup in the event that uncorrectable errors are subsequently obtained during a future readback operation. Alternatively, the degraded data may be garbage collected and migrated as set forth in FIG. 10. The next block for evaluation is selected at step 250 and the process repeats.

Figure 12:
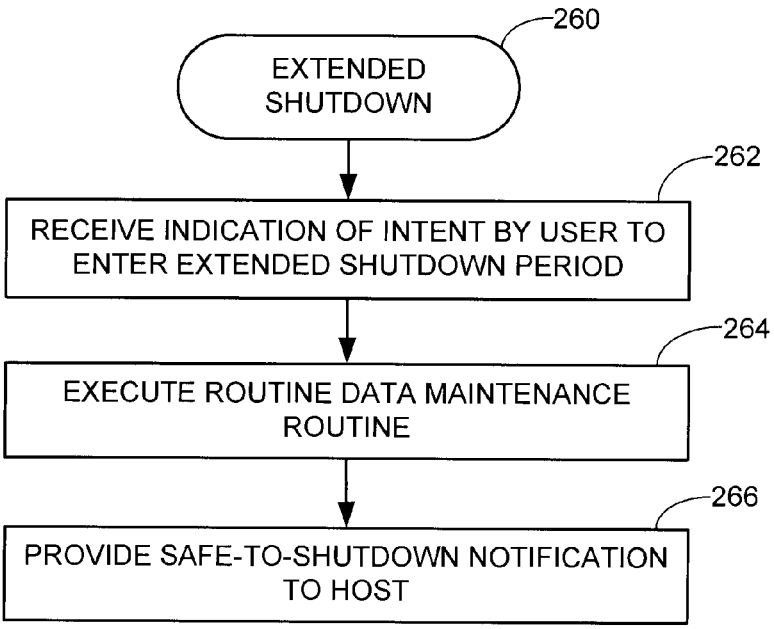
FIG. 12 provides a EXTENDED SHUTDOWN routine generally illustrative of steps carried out in accordance with various embodiments of the present invention.

FIG. 12 illustrates an EXTENDED SHUTDOWN routine 260 carried out by the controller 102 in accordance with various embodiments to prepare for an extended shutdown of the device 100. An indication is received from the user at step 262 that the user intends to shutdown the device in a non-powered state for an extended period of time. As noted above, the user may be prompted to supply such an indication to the device before taking such steps along with a warning that the data may not be reliably retrieved if these steps are not taken. Alternatively, this notification may be generated automatically responsive to a particular event being detected.

Responsive to such indication, the controller proceeds at step 264 to execute the DATA MAINTENANCE routine 240 of FIG. 11 for all blocks in the array that have been allocated to store data. Once redundancy information has been generated for all of the data, the controller provides a safe-to-shutdown notification to the host at step 266.

It will be appreciated that the various embodiments presented herein can provide a number of benefits to the operational reliability of a memory. By assessing a loss of data retention characteristics of a location of memory, steps can be taken to harden data stored in that location through the use of redundancy information. The redundancy information can be written in any suitable location. The data retention characteristics can be evaluated in a number of ways and are not limited to a number of accesses (e.g., erasure of each erasure block). For example, memory blocks operated at an elevated temperature may be adjudged to have a particular level of data retention characteristics irrespective of how many erasures have taken place. This technique could be applied to other non-volatile memory, such as magnetic discs.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. An apparatus comprising: a non-volatile memory and a controller adapted to direct storage of data in a first location of the non-volatile memory, to harden the data stored in the first location responsive to a wear indication value indicative of a wear history associated with the first location by generating redundancy information associated with the data responsive to the wear indication value and storing the redundancy information associated with the data in a different, second location of the non-volatile memory, and to perform a read operation by directing concurrent retrieval of the data from the first location and the redundancy information from the second location, and by using the redundancy information retrieved from the second location to correct at least one read error detected in the data retrieved from the first location to generate corrected data, in which the data stored in the first location comprises user data and at least one error correction code (ECC) adapted to detect and correct an error in said user data during readback thereof, and the at least one read error detected in the data is uncorrected by use of the at least one ECC.

2. The apparatus of claim 1, in which the wear indication value identifies a total accumulated number of accesses carried out to the first location, and the controller is further adapted to transfer the corrected data.

3. The apparatus of claim 1, in which the at least one error correction code is characterized as at least one ECC of a first type of ECC adapted to detect and correct an error in said user data during readback thereof, and the controller hardens said data by writing the redundancy information in the second location comprising at least one error correction code of a different, second type of ECC adapted to detect and correct an error in said data stored in the first block.

4. The apparatus of claim 1, in which the first location is in a first erasure block of a flash memory array comprising a plurality of addressable pages of memory configured to be concurrently erased during an erase operation, and in which the second location is in a different, second erasure block of the flash memory array.

5. The apparatus of claim 1, in which the at least one ECC is characterized as a first type of error correction code appended to the data stored in the first location and the redundancy information comprises a second type of ECC generated to detect and correct errors in the data stored in the first location and the first type of ECC, and the first type of ECC is different than the second type of ECC.

6. The apparatus of claim 1, in which the controller generates a first wear indication (WI) value for the first location in relation to an accumulated count of access operations upon the first location and a second WI value for a second location in relation to an accumulated count of access operations upon the second location, compares the first WI value to the second WI value, and selects the second location responsive to the second WI value being less than the first WI value.

7. The apparatus of claim 6, in which the respective first and second WI values are further generated in relation to an operational parameter associated with the respective first and second blocks.

8. The apparatus of claim 1, in which the controller further operates to harden the data stored in the first location responsive to an indication signal supplied by a host to harden said data.

9. The apparatus of claim 1, in which the controller generates the wear indication (WI) value and proceeds to generate and store the redundancy information in the second location responsive to the wear indication value exceeding a predetermined wear threshold, wherein the redundancy information is not stored responsive to the wear indication value not exceeding said threshold.

10. An apparatus comprising: a solid-state drive (SSD) having a non-volatile array of memory cells arranged into a plurality of erasure blocks, and a controller adapted to harden user data supplied by a host for storage in said array by storing said user data in a first erasure block having a first wear indication (WI) value indicative of a relatively worn state for said block, and by generating redundancy information to correct at least one error in said user data responsive to the first WI value and storing the redundancy information in a second erasure block, wherein the controller is further adapted to subsequently transfer the user data to a host device by concurrently retrieving the user data from the first location and the redundancy information from the second location, and by using the retrieved redundancy information to correct an error detected in the retrieved user data, in which the error detected in the retrieved user data is uncorrected by application of an error correction code (ECC) adapted to detect and correct at least one error in said user data during readback thereof.

11. The apparatus of claim 10, in which the controller is further adapted responsive to a request by the host to retrieve said user data by outputting a sequence of bits from the first erasure block to a local cache memory and applying the error correction code thereto to detect and correct up to a selected number of errors, the controller further using the redundancy information to correct any uncorrectable errors in said output sequence of bits to provide corrected output data.

12. The apparatus of claim 10, in which the second erasure block has a second WI value indicative of a relatively less worn state of the second erasure block, and the controller stores said redundancy information in the second erasure block responsive to a comparison of the first and second WI values.

13. A method comprising:
   storing data in a first location of a non-volatile memory as a plurality of successive sectors of user data and at least one error correction code (ECC) adapted to detect and correct at least one error in said user data during a subsequent read operation;
   identifying a wear indication value indicating a total number of access operations upon the first location;
   hardening said stored data responsive to the wear indication value by generating redundancy information associated with the stored data responsive to the wear indication value and storing the redundancy information associated with the stored data in a different, second location of the non-volatile memory; and
   performing a read operation to transfer the data in the first location to a host by retrieving the data from in the first location and the redundancy information from the second location and by using the redundancy information to correct at least one read error detected in the data retrieved from the first location, in which the at least one read error detected in the data is uncorrected by use of the at least one ECC.

14. The method of claim 13, wherein the first location is disposed in a first erasure block and the second location is disposed in a different, second erasure block with a WI value less than the WI value of the first erasure block.

15. The method of claim 14, wherein the WI value of the first location is generated in relation to an accumulated total number of erasure operations that have been carried out upon the first location.

16. The method of claim 13, in which the at least one ECC is characterized as an error correction code of a first type of ECC adapted to detect and correct at least one error in said user data during a subsequent read operation, and in which the hardening step comprises generating and storing at least one additional ECC of a different second type of ECC in the second location of the memory adapted to detect and correct at least one error in the data stored in the first location of said memory.

17. The method of claim 13, in which the performing a read operation comprises using the redundancy information from the second location to correct at least one bit error in the data retrieved from the first location to generate corrected data, and transferring the corrected data to the host.

18. The method of claim 13, in which the first location is characterized as a first erasure block of a flash memory array comprising a plurality of addressable pages of memory with each page adapted to be concurrently written during a write operation and concurrently read during a read operation, the data stored in the first block comprises data stored to a selected page thereof, and the redundancy information comprises a redundant copy of said page of data in a second erasure block, wherein data from both the first and second erasure blocks are retrieved during a read operation to recover said hardened data to a host.

19. The method of claim 13, in which the at least ECC is characterized as a first type of error correction code and the redundancy information stored during the hardening step comprises a second type of ECC generated to detect and correct errors in the data stored in the first location and the first type of ECC, and the first type of ECC is different than the second type of ECC.

20. The method of claim 13, in which the redundancy information is stored in the second location of the memory using a first voltage profile adapted for normal access operations upon relatively less worn locations of the memory, and the data are stored in the first location using a second voltage profile adapted for access operations upon relatively more worn locations, the second voltage profile having at least a selected one of a longer duration or a lower magnitude than the first voltage profile to reduce stress upon the first location.

\* \* \* \* \*